(12) United States Patent
Huitsing et al.

(10) Patent No.: US 9,653,447 B2
(45) Date of Patent: May 16, 2017

(54) LOCAL INTERCONNECT LAYER ENHANCED ESD IN A BIPOLAR-CMOS-DMOS

(71) Applicant: NXP B.V., Eindhoven (NL)

(72) Inventors: Albert Jan Huitsing, Nijmegen (NL); Jan Claes, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/495,468

(22) Filed: Sep. 24, 2014

(65) Prior Publication Data

US 2016/0086934 A1 Mar. 24, 2016

(51) Int. Cl.

| | |
|---|---|
| *H01L 29/10* | (2006.01) |
| *H01L 27/02* | (2006.01) |
| *H01L 27/082* | (2006.01) |
| *H01L 23/535* | (2006.01) |
| *H01L 23/367* | (2006.01) |
| *H01L 27/12* | (2006.01) |
| *H01L 21/8222* | (2006.01) |
| *H01L 29/417* | (2006.01) |

(52) U.S. Cl.
CPC ...... *H01L 27/0248* (2013.01); *H01L 21/8222* (2013.01); *H01L 23/367* (2013.01); *H01L 23/535* (2013.01); *H01L 27/0259* (2013.01); *H01L 27/082* (2013.01); *H01L 27/1203* (2013.01); *H01L 29/41708* (2013.01); *H01L 2924/0002* (2013.01)

(58) Field of Classification Search
CPC ............. H01L 21/8222; H01L 27/0229; H01L 27/0292; H01L 27/0266; H01L 27/1022
See application file for complete search history.

(56) References Cited

U.S. PATENT DOCUMENTS

| | | | |
|---|---|---|---|
| 4,721,682 A * | 1/1988 | Graham et al. | 438/363 |
| 4,760,433 A * | 7/1988 | Young et al. | 257/357 |
| 5,436,475 A | 7/1995 | Tews et al. | |
| 5,504,362 A * | 4/1996 | Pelella | H01L 27/0248 257/357 |
| 6,566,733 B1 | 5/2003 | Husher | |
| 6,777,784 B1 | 8/2004 | Vashchenko et al. | |
| 2006/0118912 A1* | 6/2006 | Guarin et al. | 257/577 |
| 2008/0157280 A1* | 7/2008 | Kim | 257/587 |

(Continued)

FOREIGN PATENT DOCUMENTS

| | | |
|---|---|---|
| WO | 2005001930 A1 | 1/2005 |
| WO | 2005052997 A2 | 6/2005 |

OTHER PUBLICATIONS

"EP Search report dated Jan. 29, 2016 for EP Application No. 15186224".

*Primary Examiner* — Matthew Gordon

(57) ABSTRACT

Disclosed is a PNP ESD integrated circuit, including a substrate, an active region formed within the substrate, the active region including at least one base region of a second conductivity type, a plurality of collector regions of a first conductivity type formed within the active region, a plurality of emitter regions of the first conductivity type formed within the active region, and a local interconnect layer (LIL) contacting the plurality of emitter regions and the plurality of collector regions, the LIL including cooling fin contacts formed on the collector regions to enhance the current handling capacity of the collector regions.

22 Claims, 3 Drawing Sheets

(56) References Cited

U.S. PATENT DOCUMENTS

| | | | |
|---|---|---|---|
| 2008/0169513 A1* | 7/2008 | Denison | H01L 27/0259 257/370 |
| 2012/0007207 A1* | 1/2012 | Salcedo | 257/491 |
| 2013/0214821 A1* | 8/2013 | Chen | H03K 17/127 327/109 |
| 2013/0320396 A1* | 12/2013 | Salman | H01L 27/0248 257/119 |
| 2014/0252470 A1* | 9/2014 | Chen | H01L 29/66659 257/337 |

* cited by examiner

LOCAL INTERCONNECT LAYER ENHANCED ESD IN A BIPOLAR-CMOS-DMOS

TECHNICAL FIELD

Various embodiments disclosed herein relate generally to a BCD PNP transistor used for ESD protection and a method of manufacturing the same. The BCD PNP transistor uses interconnect cooling fins to reduce on-resistance, reduce the silicon footprint, and increase robustness, thus enhancing the performance of products that use the technology.

Bipolar-CMOS-DMOS ("BCD") technology is a group of silicon processes. Each of the processes has a strength that can be combined with the strengths of the other processes on a single chip. Bipolar technology is useful for precise analog functions. Complementary Metal Oxide Semiconductor ("CMOS") is useful for digital design, and Diffused Metal Oxide Semiconductor ("DMOS") is useful for high-voltage and power applications. This combination of technologies offers many advantages such as improved reliability, reduced electromagnetic interference and smaller chip area for active components. BCD is widely used in a variety of products. The integration of BCD into Silicon-on-Insulator ("SOI") buried insulator substrates adds greater stability and is used, for example, in electromechanical, automotive safety, and audio environments.

SUMMARY

A brief summary of various embodiments is presented below. Some simplifications and omissions may be made in the following summary, which is intended to highlight and introduce some aspects of the various embodiments, but not to limit the scope of the embodiments described herein. Detailed descriptions of embodiments adequate to allow those of ordinary skill in the art to make and use the inventive concepts will follow in later sections.

The embodiments described herein seek to provide an integrated circuit to improve upon device characteristics of a PNP ESD device.

According to one embodiment, there is provided an integrated circuit including a substrate, an active region formed within the substrate, a plurality of collector regions formed within the active region, a plurality of emitter regions formed within the active region, and a local interconnect layer (LIL) contacting the plurality of emitter regions and the plurality of collector regions, the LIL including cooling fin contacts formed on the collector regions to enhance the current handling capacity of the collector regions.

The emitter regions and collector regions may be formed in an alternating manner in a direction of current flow. A length of the cooling fins may be formed to be substantially as long as the collector regions in the direction of current flow.

A length of the cooling fins may encompass 80% of a length of the collector regions. A length of the cooling fins may encompass a maximum length that design rules will allow.

The integrated circuit may include shallow trench isolation (STI) regions formed to surround at least one emitter region and collector region.

The integrated circuit may include an LIL contact formed on the active region on the emitter regions, the LIL contact having a length smaller than the length LIL cooling fin contact.

The integrated circuit may be a BCD semiconductor device.

The LIL layer may include tungsten, copper, aluminum, or a combination of copper and aluminum. The LIL may be a lowest metal interconnect level of the substrate.

The integrated circuit may include a SOI buried insulating layer formed within the substrate below the emitter regions and collector regions.

The length of the LIL cooling fin is as long as the processing parameters allows.

According to a further embodiment, there is provided an electrostatic discharge device, including a substrate, an active region formed within the substrate, the active region including at least one base region, a plurality of collector regions disposed within the active region, a plurality of emitter regions disposed within the active region, a plurality of local interconnect layer (LIL) contacts having a first lengths and contacting the plurality of emitter regions, a plurality of LIL cooling fins having second lengths and contacting the plurality of collector regions, the second lengths being larger than the first lengths and formed to decrease the on-resistance of the electrostatic discharge device.

The LIL cooling fins may have the same widths and heights as the LIL contacts.

Single emitter regions and single collector regions are disposed in an alternating manner in a direction of current flow. Shallow trench isolation regions may be formed between the single emitter regions and single collector regions.

According to a further embodiment there is provided a method of manufacturing an integrated circuit, including forming a semiconductor substrate, forming an active region within the substrate, the active region including at least one base region, forming a plurality of collector regions within the active region, forming a plurality of emitter regions within the active region, and forming a local interconnect layer (LIL) contacting the plurality of emitter regions and the plurality of collector regions, the LIL including cooling fin contacts on the collector regions to enhance the current handling capacity of the collector regions.

The cooling fins may be substantially as long as the collector regions in the direction of current flow. A length of the cooling fins may encompass may encompass a maximum length that design rules will allow.

The method may include forming a second LIL contact on the emitter regions, the second LIL contact having a length smaller than the length of the LIL cooling fin contact.

BRIEF DESCRIPTION OF THE DRAWINGS

Exemplary embodiments of the embodiments described herein are described in more detail and by way of non-limiting examples with reference to the accompanying drawings, wherein.

DETAILED DESCRIPTION

Figure 1:
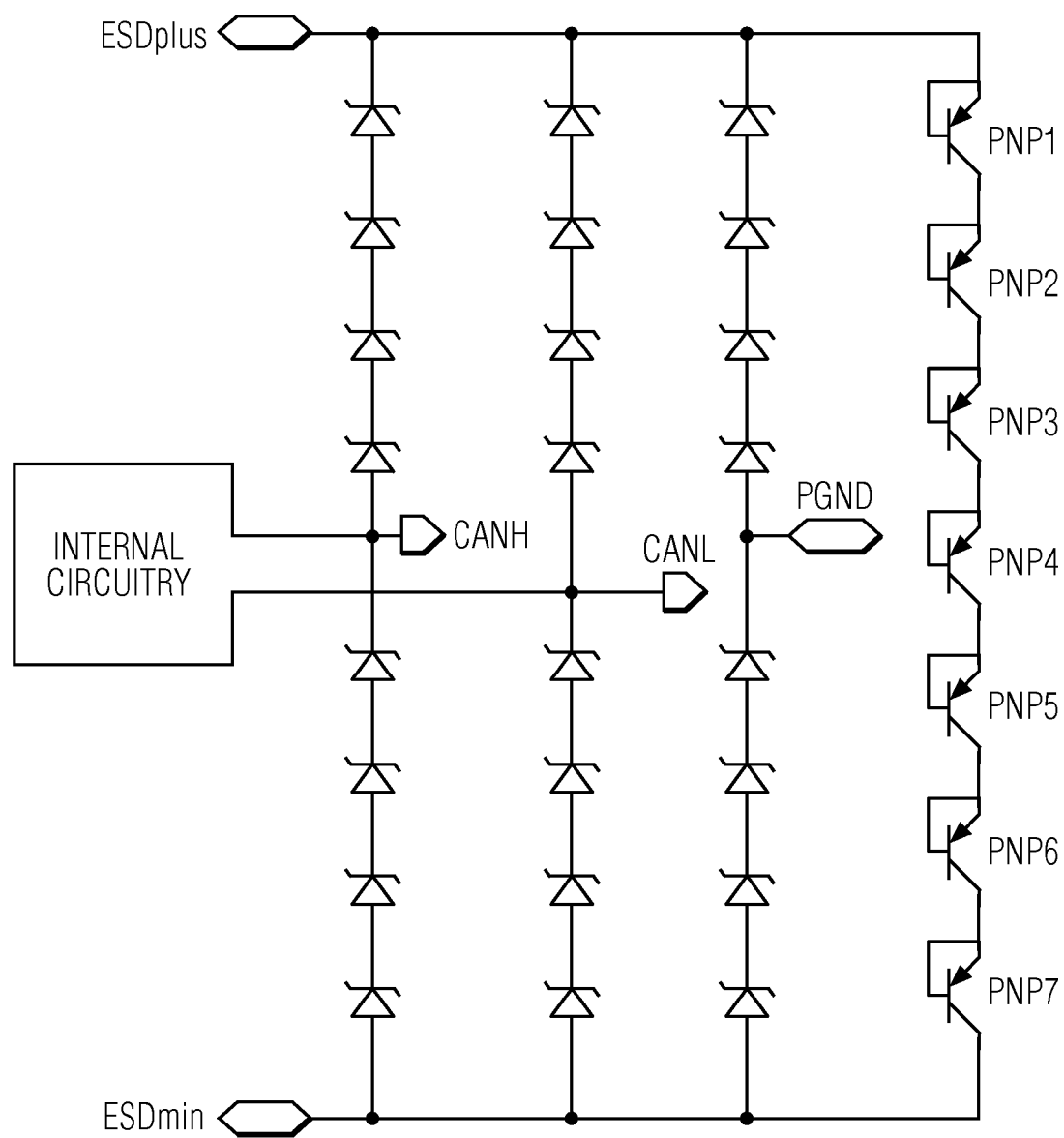
FIG. 1 schematically illustrates a circuit diagram of an ESD protection scheme for a CAN bus output in accordance with an embodiment.

It should be understood that the Figures are merely schematic and are not drawn to scale. It should also be understood that the same reference numerals are used throughout the Figures to indicate the same or similar parts.

The descriptions and drawings illustrate the principles of the embodiments described herein. It will thus be appreciated that those skilled in the art will be able to devise various arrangements that, although not explicitly described or shown herein, embody the principles of the embodiments described herein and are included within its scope. Furthermore, all examples recited herein are principally intended expressly to be for pedagogical purposes to aid the reader in understanding the principles of the embodiments described herein and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

For every semiconductor product, an Electrostatic Discharge ("ESD") protection strategy may be provided to prevent early failures because of ESD damage. In this technology the usage of PNP bipolar transistors together with diodes is common. Other protection devices include, but are not limited to, diode chains, snapback devices and edge triggered devices.

FIG. 1 illustrates a circuit diagram of an ESD protection scheme for a CAN bus output in accordance with an embodiment. FIG. 1 illustrates an ESD protection scheme for a Controller Area Network ("CAN") bus output, with a stack of seven series-connected PNP transistors. CAN is a vehicle bus standard designed to allow microcontrollers and devices to communicate with each other within a vehicle without a host computer.

FIG. 1 illustrates the importance of having the size of ESD clamps as constrained as possible. The seven PNP transistors connected in series make up an ESD clamp. Each PNP transistor can have a width of about 3,000 µm, equating to a total width of 21 mm, which is large amount of silicon area used.

The ESD clamp is constructed in such way that the turn-on voltage, as well as on-resistance and the current handling capability are tuned towards the device layout. Generally speaking, such a configuration of devices requires a considerable amount of silicon footprint.

As result it is desirable to have an ESD structure and method that can increase device performance while not adding process steps, and does not consume additional silicon real estate.

Figure 2:
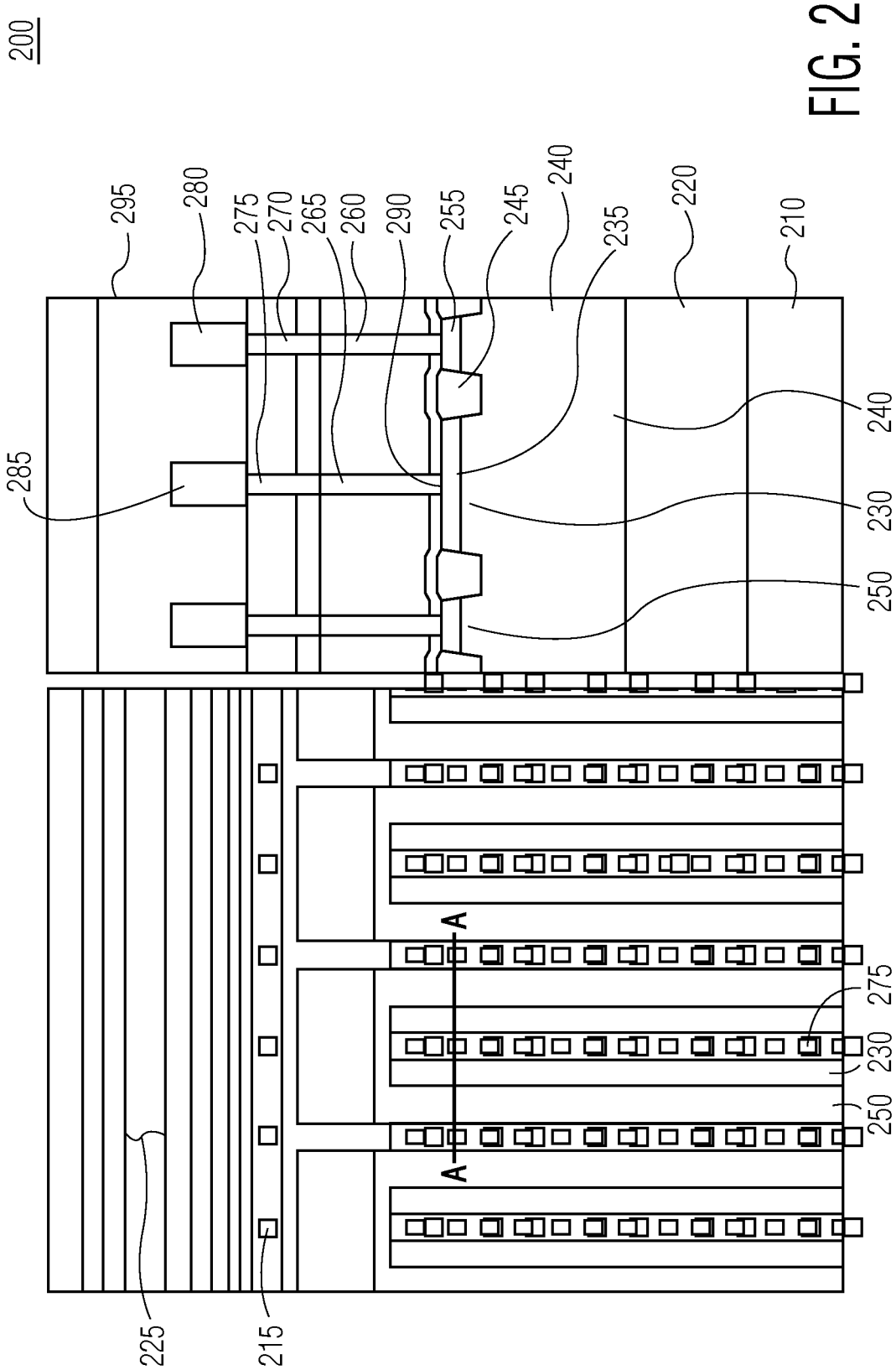
FIG. 2 schematically illustrates a top view of part of an ESD clamp with LIL connectors and a cross-sectional view of the embodiment.

FIG. 2 schematically illustrates a top view of part of a clamp with normal LIL connectors and a cross-sectional view taken along the lines A-A of an embodiment.

In the cross sectional view of FIG. 2 a PNP clamp 200 of a BCD semiconductor device is formed on a substrate region 210. An active region 240 such as an epitaxial layer is formed above the substrate 210 and a buried insulator layer 220 is formed between the active region 240 and the substrate 210. The active region 240 may be doped of a first conductivity type or a second conductivity type and have a base region formed therein (not illustrated) to act as a base of the PNP ESD device.

Emitter regions 250 and collector regions 230 are respectively formed of a conductivity type opposite to that of the base regions and are formed at the top surface of the active region 240. An emitter contact layer 255 and a collector contact layer 235 may be doped to be highly conductive to facilitate greater conductivity between the current carriers moving through the active region 240. The collector regions 230 and collector contact regions 235 are formed to have a larger area than the emitter regions 250 and emitter contact regions 255. The larger collector regions 230 allow the current carriers moving from the base to the collector to be accumulated and discharged.

Emitter regions 250 and collector regions 230 are separated by shallow trench isolation (STI) regions 245 or walls that are formed in the active region 240. STI or compatible isolation regions such a local oxidation of silicon (LOCOS) may be used. The STI regions 245 may function to clearly define the transistor regions to allow current to properly flow from emitter to base to collector, and avoid unwanted migration of charge carriers.

As illustrated in FIG. 2, a plurality of passivation layers 295 are formed atop the active region 240 in order to provide support for various metallizations and back-end processing of the device. Metallization and interconnection to peripheral circuitry may be implemented in the region 225. Interconnections may be made to base connections 215, collector connections 285 and emitter connections 280. An interconnect level above the active region 240 may, for example, include a local interconnect layer ("LIL") of the integrated circuit. LIL is a processing step that may be used for making trace-like connections between contact layers 270 and 275 and a semiconductor substrate 200. As illustrated in FIG. 2, LILs 260 and 265 are formed to have a length, width and height LIL 265 creates a contact area 290 between the collector region 230.

The LIL is provided as part of back end of line processing. Because the use of metal is prohibited during front end of line of processing, an example embodiment allows the formation of a metal Schottky contact, using standard processing as is known in the art, in which a standard LIL metallization process can be employed to provide the metal contacts to the collector 230 and the emitter 250.

As illustrated in FIG. 2, LILs 260 are formed to be at least the same length and width as contact layers 270. Metallization layers 280 and 285 may be formed above the contact layers 270 to connect underlying circuitry to external devices.

During electrostatic discharge, thermal handling may affect the operation of the device. Viewing the cross-section of the active regions 240, the junction to be broken down during ESD stress events in the collector regions 230 is enclosed between the STI walls 245, so heat may only be released upwards and downwards, and in the length direction of the PNP 200 (i.e., in and out of the page of the cross-sectional view). As a result, thermal build-up is confined between the two STI walls. Without a way to dissipate heat upwards through the LIL 260 and other layers, only downward dissipation is possible because the passivation layers 295 and STI regions 245 do not readily conduct heat.

Figure 3:
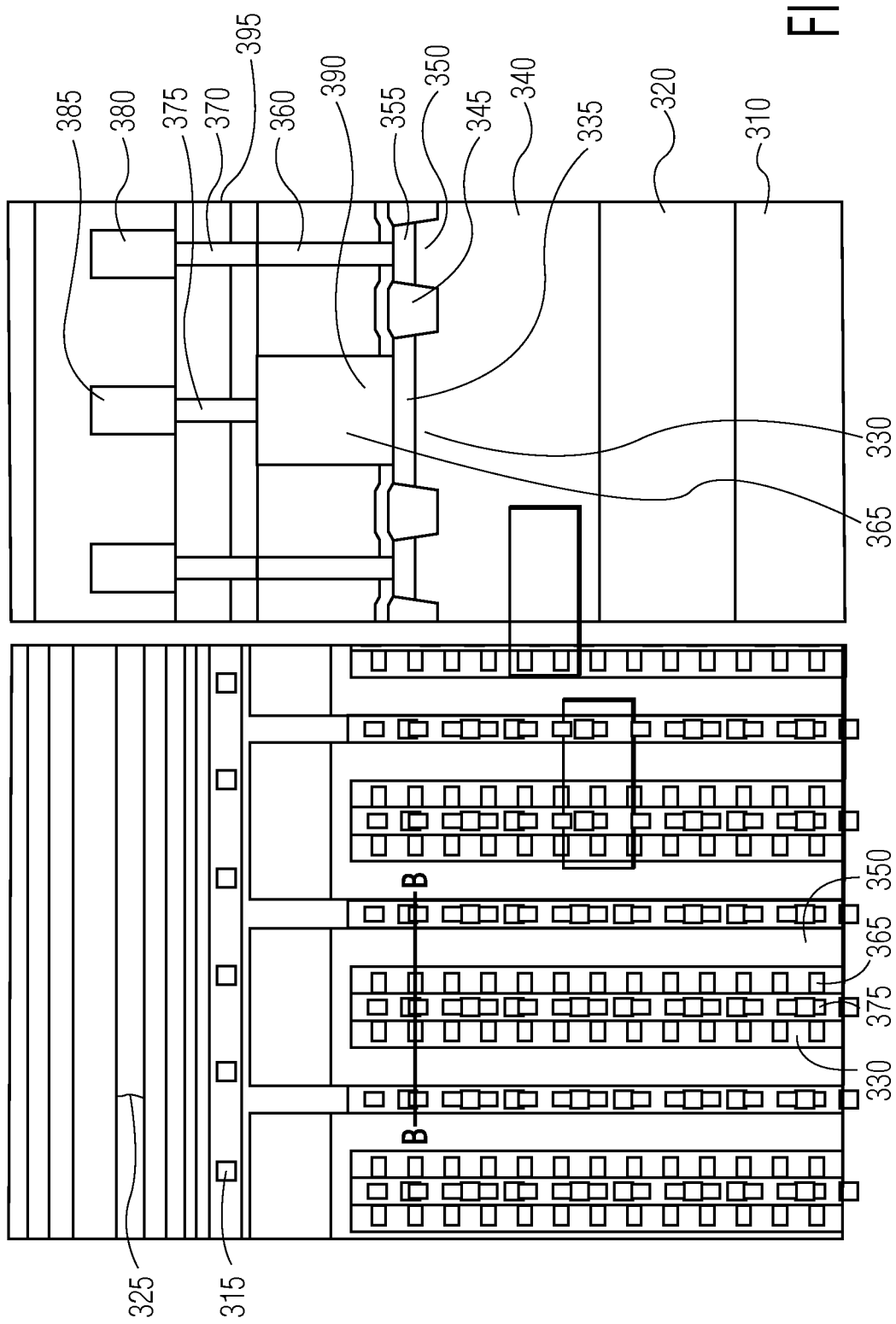
FIG. 3 schematically illustrates a top view of part of an ESD clamp with long LIL cooling fins and a cross-sectional view of the embodiment.

FIG. 3 schematically illustrates a top view of part of an ESD clamp 300 of a BCD semiconductor device with long LIL cooling fins 365 and a cross-sectional view of the embodiment. The method of manufacturing the components and layers of the PNP ESD clamps 200 and 300 described herein may be formed according to well-known semiconductor processing techniques.

Factors determining the robustness of an ESD protection device are determined by the maximum amount of current that may be handled by the device as well as heat that may be dissipated. By applying longer strips of LIL on the collector than have been previously implemented, which may be described as cooling fins, device robustness and reliability can be increased by greater than 10%. Also, by using a long LIL fin 365, the silicon footprint can be reduced by 10%, while maintaining the same device robustness. Thus, an additional structure can be provided to better dissipate heat and allow current to flow in a PNP transistor to improve the device performance thereof during an ESD event, as is described herein.

As illustrated in FIG. 3, the PNP ESD integrated circuit clamp 300 includes a substrate 310, a buried insulator layer 320 formed in the substrate, an epitaxial layer doped with a first or second conductivity type defining an active region 340 having a first top surface and a second bottom surface, with the second surface in contact with the buried insulator layer 320. The active region 340 may include a base well region of a second conductivity type (not illustrated).

A plurality of collector regions 330 of a first conductivity type are formed within the active region 340 and in contact with the base region (not illustrated). A plurality of emitter regions 350 of the first conductivity type are formed within the active region 340 and in contact with the base region (not illustrated). As illustrated in FIG. 3, the plurality of collector regions 330 and plurality of emitter regions 350 may be disposed in an alternating fashion within the active region 340. In this manner, a large and efficient area can be created. In an embodiment of the PNP ESD device 300, the emitter regions 350 are shorted to the base regions to enhance the speed of current flow from emitter to collector in the case of an ESD event. Current in the PNP transistor 300 flows in a horizontal direction from emitter regions to collector regions 330 as illustrated in FIG. 3.

The distances, or pitch, sizes between the collector regions 330, emitter 350 regions and base regions (not illustrated) can be optimized in order to obtain maximum performance, on resistance and/or trigger voltage of the PNP ESD device.

As illustrated in FIG. 3, a plurality of passivation layers 395 are formed atop the active region 340 in order to provide support for various metallizations and back-end processing of the device. Metallization and interconnection to peripheral circuitry may be implemented in the region 325. Interconnections may be made to base connections 315, collector connections 385 and emitter connections 380. During the processing step of forming the LIL layer, a LIL 360 is formed to have a length, width and height, creating a small contact area 390 with the emitter regions 350 within the active region 340 LIL 360 is formed on the first surface of the active region atop the emitter regions 350 in contact with highly doped emitter contact regions 355, where the LIL 360 is formed to have a first length. Formation and use of the highly doped emitter contact regions 355 may or may not be used.

In addition to the LIL 360, a LIL cooling "fin" or strip 365 may be formed atop highly doped collector contacts 335. Formation and use of the high doped collector contacts 335 may or may not be used. The LIL cooling fin is formed to have the same height and width of the LIL 360, and a longer length. The structure is being called a "fin" because it acts like various heat sink "fins" that are known in related arts to dissipate heat and improve performance of a given device. The LIL layer 360 along with LIL cooling fins 365 may be formed by known processes, such as photo-masking and etching, or by various deposition techniques as are known in the art.

The LIL layer 360 and the collector cooling fin 365 may be made of tungsten, copper, aluminum, a combination of copper and aluminum, or of other interconnect materials as are known in the art. The LIL is a lowest metal interconnect level of the PNP ESD device 300.

The long LIL cooling fins 365 formed on the first surface of the active region 340 atop the collector regions 330 enhance the current handling capacity of the collector regions 330. The LIL cooling fins 365 may be formed as Schottky contacts, directly contacting the semiconductor collector contact regions 335. The length of the cooling fins 365 may be formed to be substantially as long as the collector regions 330 in the direction of current flow. The length of the LIL cooling fin 365 may be as long as standard processing parameters allow.

Shallow trench isolation (STI) regions 345 are formed between the emitter regions 350 and the collector regions 330 to isolate individual PNP transistors and allow the current to flow more readily in case of an ESD event.

As illustrated and described, the LIL cooling fins 365 create an interface 390 between the LIL layer 365 and collector contact region 335 that is five to six times the size of the interface 290 of FIG. 2. This larger interface 390 allows greater current and heat to flow through collector region 330 and collector contact region 335 than in previous embodiments.

Because the LIL fins 365 are longer than the standard LIL layers, such as the LIL 355 formed atop the emitter regions, a greater amount of current and heat that is drawn into the collector region 330 may pass through the PNP ESD devices 300. Experiments were conducted with long LIL fins over the smaller emitter regions 350, but no additional performance gain was obtained by forming the LIL fins in the emitter regions 350.

Advantages of using the LIL cooling fins 365 in the collector regions 330 are summarized in Table 1. While the turn on voltage vt1 remained constant with the addition of using the LIL cooling fin 330, a significant increase in device characteristics has been determined. The current handling capability, or robustness of an ESD PNP 300 has increased over 12% in comparison to the PNP 200 illustrated in FIG. 2 by using the longest possible cooling fin in relation to the size of a collector region, which also relates to the performance increase of the device. Also, because of the long fin 365, the on-resistance of the device was measured to decrease on the order of 10%. Taken as a whole, the use of the cooling fin reduces the silicon footprint by 10% or improves the device performance by 10% over PNP ESD devices such as the device 200 illustrated in FIG. 2 that do not use the cooling fin in the collector region.

TABLE 1

Measurement data illustrating the increase performance

| | Reference | LIL enhancement | Change |
|---|---|---|---|
| Turn on trigger voltage vt1 | 10.8 V | 10.8 V | 0% |
| Current handling capability | 1.77 mA/μm | 1.98 mA/μm | +12% |
| On resistance | 2050 Ω* μm | 1875 Ω* μm | −10% |

Additional features of the PNP ESD device 300 will be described. The width of an LIL cooling fin 365 is equal to a width of contact hole that is formed atop the LIL fin 365. The length of the LIL fin 365 is formed to be as long as processing parameters will allow the LIL fin 365 to extend the length of the collector region. The length of the LIL fin 365 could thus be formed to be over 50% including up to 80% or 90% or more of the length of the collector regions 330. Embodiments described herein may maximize the length of the LIL fin 365 to a highest percentage that the technology's design rules will allow to get as much LIL cooling fin 365 length within the collector region perimeter. This is dependent on the specific technology's design rule manual.

According to standard design processes, the contact hole for a tungsten (W) plug 370 may be formed of a square. The width of the LIL cooling fin 365 may be the same as the contact plug 370. At least one contact hole connects to a LIL cooling fin. In the design technology used, LIL connections and fins 365 may be drawn explicitly. After finalization of a design, a mask manipulation takes place where a physical LIL mask is generated by connecting LIL with a contact hole. Anywhere a contact hole is drawn, an LIL contact 370 or fin 365 is placed. Metallization layers 380 and 385 may be formed above the contact layers 370 and 375 to connect underlying circuitry to external devices.

For any ESD clamp device, one will place the contacts 370 and 375 at a minimum distance from each other in order to obtain a low-ohmic connection.

Though embodiments related to the use of PNP transistors have been described herein, embodiments described herein may also be just as effective using NPN transistors. Although embodiments described herein are illustrated and described using a buried insulator layer 320, the properties exemplified by the novel long LIL cooling fin 365 structure are applicable to non-SOI substrates. The benefits of using the LIL cooling fin 365 would also accrue to a Si substrate that does not have the interspersed buried insulator layer.

It should be noted that the above-mentioned embodiments illustrate rather than limit the embodiments described herein, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The embodiments described herein can be implemented by means of hardware including several distinct elements. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. An integrated circuit, comprising:
   a substrate having a first surface and a second surface;
   an active region formed within the substrate;
   a plurality of collector regions each having a first area formed within the active region;
   a plurality of emitter regions each having a second area smaller than the first area and formed within the active region;
   a plurality of collector contact regions formed at the first surface of the substrate;
   a plurality of emitter contact regions formed at the first surface of the substrate;
   a local interconnect layer (LIL) disposed at a level above the emitter contact regions and collector contact regions directly contacting the plurality of emitter contact regions and the plurality of collector contact regions, the LIL including cooling fin contacts formed at the level on the collector contact regions to enhance the current handling capacity of the collector regions; and
   an LIL contact formed at the level on the active region on the emitter contact regions, the LIL contact having a length smaller than a length of an LIL cooling fin contact.

2. The integrated circuit of claim 1, wherein the emitter regions and collector regions are formed in an alternating manner in a direction of current flow.

3. The integrated circuit of claim 1, wherein a length of the cooling fins are formed to be substantially as long as the collector regions in a direction of current flow.

4. The integrated circuit of claim 1, wherein a length of the cooling fin contacts encompasses no more than 80% of a length of the collector regions.

5. The integrated circuit of claim 1, comprising:
   a contact layer having first contacts formed above the LIL; and
   a metallization layer having second contacts formed above the contact layer;
   wherein a length of the cooling fins is longer than lengths of the first contacts and second contacts.

6. The integrated circuit of claim 1, comprising:
   shallow trench isolation (STI) regions formed to surround at least one emitter region and collector region.

7. The integrated circuit of claim 1, wherein the integrated circuit is a BCD semiconductor device.

8. The integrated circuit of claim 1, wherein the LIL comprises tungsten, copper, aluminum, or a combination of copper and aluminum.

9. The integrated circuit of claim 1, wherein the LIL is a lowest metal interconnect level of the substrate.

10. The integrated circuit of claim 1, comprising a SOI buried insulating layer formed within the substrate below the emitter regions and collector regions.

11. The integrated circuit of claim 1, wherein the LIL contact and LIL cooling fin contacts are each made of a continuous layer of metal across the underlying contacts.

12. An electrostatic discharge device, comprising:
   a substrate having a first surface and a second surface;
   an active region formed within the substrate, the active region including at least one base region;
   a plurality of collector regions each having a first area disposed within the active region;
   a plurality of emitter regions each having a second area smaller than the first area disposed within the active region;
   a plurality of collector contact regions formed at the first surface of the substrate;
   a plurality of emitter contact regions formed at the first surface of the substrate;
   a plurality of local interconnect layer (LIL) contacts disposed at a level above the substrate having first lengths and contacting the plurality of emitter contact regions;
   a plurality of LIL cooling fins disposed at the level above the substrate having second lengths and directly contacting the plurality of collector contact regions, the second lengths being larger than the first lengths and formed to decrease the on-resistance of the electrostatic discharge device.

13. The device of claim 12, wherein the LIL cooling fins have the same widths and heights as the LIL contacts.

14. The device of claim 12, wherein single emitter regions and single collector regions are disposed in an alternating manner in a direction of current flow.

15. The device of claim 12, comprising:
   shallow trench isolation regions formed between the single emitter regions and single collector regions.

16. The integrated circuit of claim 12, further comprising:
a contact layer having first contacts formed above the LIL; and
a metallization layer having second contacts formed above the contact layer;
wherein a length of the cooling fins is longer than lengths of the first contacts and second contacts.

17. The device of claim 12, wherein the LIL contact and LIL cooling fin contacts are each made of a continuous layer of metal across the underlying contacts.

18. A method of manufacturing an integrated circuit, comprising:
forming a semiconductor substrate having a first surface and a second surface;
forming an active region within the substrate, the active region including at least one base region;
forming a plurality of collector regions each having a first area within the active region;
forming a plurality of emitter regions each having a second area smaller than the first area within the active region;
forming a plurality of collector contact regions at the first surface of the substrate;
forming a plurality of emitter contact regions at the first surface of the substrate and forming a local interconnect layer (LIL) at a level above the emitter contact regions and collector contact regions directly contacting the plurality of emitter contact regions and the plurality of collector contact regions, the LIL including cooling fin contacts at the level on the collector contact regions to enhance the current handling capacity of the collector regions; and
an LIL contact formed at the level on the active region on the emitter contact regions, the LIL contact having a length smaller than a length of an LIL cooling fin contact.

19. The method of claim 18, comprising:
forming the cooling fin contacts to be substantially as long as the collector regions in a direction of current flow.

20. The method of claim 18, comprising:
forming a contact layer having first contacts formed above the LIL layer; and
forming a metallization layer having second contacts formed above the contact layer;
wherein a length of the cooling fins is longer than lengths of the first contacts and second contacts.

21. The method of claim 18, comprising:
forming a second LIL contact on the emitter regions, the second LIL contact having a length smaller than a length of the LIL cooling fin contact.

22. The method of claim 18, comprising forming each of the LIL contact and LIL cooling fin contacts of a continuous layer of metal across the underlying contacts.

* * * * *